US012593429B2

(12) United States Patent
Okubo et al.

(10) Patent No.: US 12,593,429 B2
(45) Date of Patent: Mar. 31, 2026

(54) NOISE SUPPRESSION SHEET AND CABLE

(71) Applicant: TDK Corporation, Tokyo (JP)

(72) Inventors: Toshiro Okubo, Tokyo (JP); Shun Kudo, Tokyo (JP); Kazuki Onuma, Tokyo (JP)

(73) Assignee: TDK Corporation, Tokyo (JP)

( * ) Notice: Subject to any disclaimer, the term of this patent is extended or adjusted under 35 U.S.C. 154(b) by 91 days.

(21) Appl. No.: 18/317,468

(22) Filed: May 15, 2023

(65) Prior Publication Data

US 2023/0380122 A1     Nov. 23, 2023

(30) Foreign Application Priority Data

May 20, 2022     (JP) ................................. 2022-082748

(51) Int. Cl.
H01B 7/18          (2006.01)
H05K 9/00          (2006.01)

(52) U.S. Cl.
CPC ......... H05K 9/0088 (2013.01); H01B 7/1875 (2013.01); H05K 9/0098 (2013.01)

(58) Field of Classification Search
CPC .......... H01B 7/02; H01B 7/29; H01B 7/1875; H01B 9/021; H01B 9/022; H01B 9/023; H01B 11/06; H01B 11/18; H01B 11/1826; H01B 11/1895; H05K 7/1875; H05K 9/0075; H05K 9/0088; H05K 9/0098; B32B 5/16; B32B 7/025; B32B 7/06; B32B 15/012
USPC ........................... 174/35 C, 36, 102 R–120 R
See application file for complete search history.

(56) References Cited

U.S. PATENT DOCUMENTS

| | | | | | |
|---|---|---|---|---|---|
| 5,262,591 | A | * | 11/1993 | Aldissi | ..................... C08K 3/24 174/106 SC |
| 7,342,172 | B1 | * | 3/2008 | Wang | ................. H01B 11/1083 174/36 |
| 10,225,967 | B2 | * | 3/2019 | Nakatani | ............ H01B 11/1895 |
| 10,588,250 | B2 | * | 3/2020 | Woo | ...................... B32B 27/365 |
| 2004/0055772 | A1 | * | 3/2004 | Tsutsui | ............... H01B 11/1016 174/36 |
| 2004/0173368 | A1 | * | 9/2004 | Dickson | ................. H01B 9/027 174/394 |
| 2008/0002308 | A1 | | 1/2008 | Kudo et al. | |

(Continued)

FOREIGN PATENT DOCUMENTS

| | | |
|---|---|---|
| JP | 05-235582 A | 9/1993 |
| JP | H08-279690 A | 10/1996 |

(Continued)

OTHER PUBLICATIONS

Notice of Reasons for Refusal received in corresponding Japanese Patent Application No. 2022-082748, dated Feb. 17, 2026.

*Primary Examiner* — William H. Mayo, III
(74) *Attorney, Agent, or Firm* — Rimon P.C.

(57)          ABSTRACT

A noise suppression sheet that includes a first magnetic layer. The first magnetic layer includes a plurality of first regions stacked in a thickness direction of the noise suppression sheet and a second region positioned between the first regions. The first magnetic layer includes a first metal component of Ni, a second metal component of Fe, and a third metal component other than Ni and Fe. The concentration of the third metal component in the second region is higher than the concentration of the third metal component in the first regions.

15 Claims, 3 Drawing Sheets

(56)                    References Cited

U.S. PATENT DOCUMENTS

2016/0360653 A1 * 12/2016  Sumi .................. H01B 11/1016
2020/0227358 A1     7/2020  Kikitsu et al.
2021/0354426 A1 * 11/2021  Yamada ................ B32B 15/015
2021/0360839 A1 * 11/2021  Yamada ............... H05K 9/0088

FOREIGN PATENT DOCUMENTS

JP          09-331182  A     12/1997
JP          2007-335788 A    12/2007
JP          2017-199871 A    11/2017
JP           2019110166 A  *  7/2019    .............. H05K 9/00
JP          2020-113650 A     7/2020
WO     WO-2019124406 A1 *  6/2019    .............. H05K 9/00

* cited by examiner

NOISE SUPPRESSION SHEET AND CABLE

CROSS-REFERENCE TO RELATED APPLICATION

This application claims the benefit of Japanese Patent Application No. 2022-082748, filed on May 20, 2022, the entire disclosure of which is incorporated by reference herein.

BACKGROUND

The present disclosure relates to a noise suppression sheet and a cable.

JP 2017-199871A discloses a magnetic shield having a structure in which a conductive layer formed of Cu and a plurality of magnetic layers formed of NiFe are stacked one on another.

However, in the magnetic shield described in JP 2017-199871A, a non-magnetic metal film is interposed between the plurality of NiFe magnetic layers, lowering permeability in the thickness direction of the magnetic shield, which causes lack of a shielding effect in a low-frequency region.

SUMMARY

A noise suppression sheet according to one embodiment of the present disclosure includes a first magnetic layer. The first magnetic layer includes a plurality of first regions stacked in a thickness direction of the noise suppression sheet and a second region positioned between the first regions. The first magnetic layer includes a first metal component of Ni, a second metal component of Fe, and a third metal component other than Ni and Fe. The concentration of the third metal component in the second region is higher than the concentration of the third metal component in the first regions.

BRIEF DESCRIPTION OF THE DRAWINGS

The above features and advantages of the present disclosure will be more apparent from the following description of certain preferred embodiments taken in conjunction with the accompanying drawings, in which.

DETAILED DESCRIPTION OF THE EMBODIMENTS

An object of the present disclosure is to provide a noise suppression sheet and a cable which have a high shielding effect.

Preferred embodiments of the present disclosure will be explained below in detail with reference to the accompanying drawings.

Figure 1:
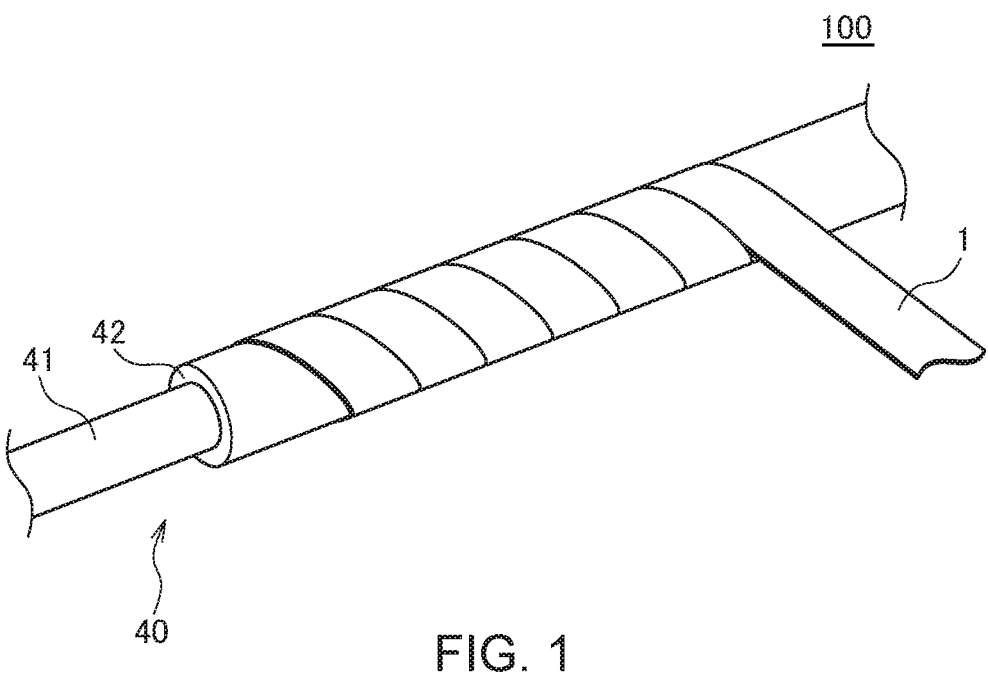
FIG. 1 is a schematic view of a cable 100 having a cable body 40 wound with a noise suppression sheet 1 according to an embodiment of the present disclosure.

FIG. 1 is a schematic view of a cable 100 having a cable body 40 wound with a noise suppression sheet 1 according to an embodiment of the present disclosure. The cable body 40 is constituted of a core material 41 and a protective material 42 such as a braided wire covering the periphery of the core material 41, and the noise suppression sheet 1 having a tape (ribbon) shape is spirally wound around and stuck to the outer periphery of the protective material 42. The noise suppression sheet 1 according to the present embodiment is thus wound around the periphery of the cable body 40 for transmitting signals or electric power so as to shield electromagnetic wave noise. Although a noise suppression sheet is used for the cable 100 in the present embodiment, the application thereof is not limited to this. For example, the noise suppression sheet 1 may be used by being stuck to an electronic device housing.

Figure 2:
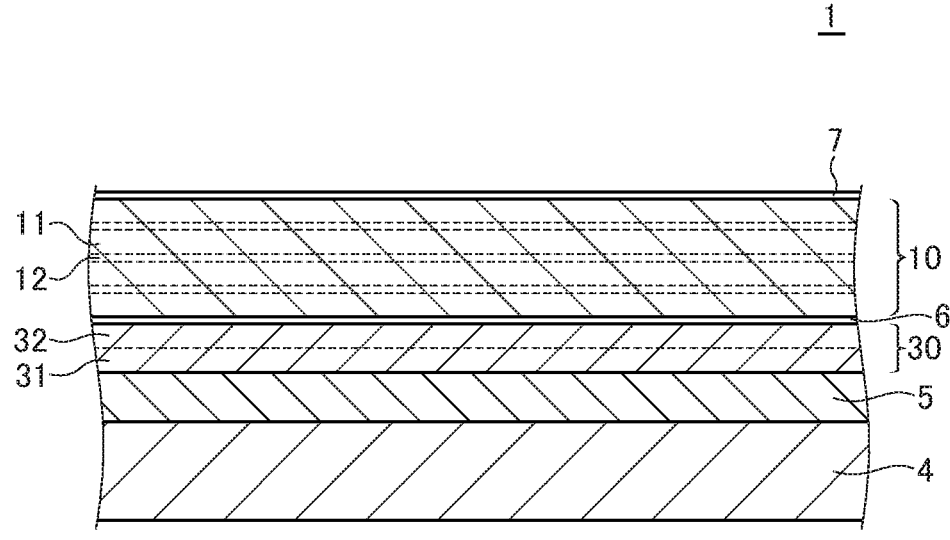
FIG. 2 is a schematic cross-sectional view for explaining the structure of the noise suppression sheet 1 according to a first embodiment of the present disclosure.

FIG. 2 is a schematic cross-sectional view for explaining the structure of the noise suppression sheet 1 according to a first embodiment of the present disclosure.

As illustrated in FIG. 2, the noise suppression sheet 1 according to the first embodiment includes a peeling layer 4, a resin layer 5 provided on the surface of the peeling layer 4, a conductive layer 30 provided on the surface of the resin layer 5, a first magnetic layer 10 stacked on the conductive layer 30 through a metal film 6, and a rustproof layer 7 provided on the surface of the first magnetic layer 10. The peeling layer 4 is formed of an insulating resin material such as PET (Polyethylene Terephthalate). Upon winding the noise suppression sheet 1 on the cable body 40, the peeling layer 4 is removed. The thickness of the peeling layer 4 is about 38 μm, for example. The resin layer 5 is formed of an insulating resin material, examples of which include, for example, polyvinyl chloride-based resin, polycarbonate-based resin, polystyrene-based resin, polymethylmethacrylate-based resin, polyester-based resin, polysulfone-based resin, polyphenylene oxide-based resin, polybutadiene-based resin, poly(N-vinyl carbazole)-based resin, hydrocarbon-based resin, ketone-based resin, phenoxy-based resin, polyamide-based resin, ethylcellulose-based resin, vinyl acetate-based resin, ABS-based resin, urethane-based resin, melamine-based resin, acrylic-based resin, unsaturated polyester-based resin, alkyd-based resin, epoxy-based resin, silicon-based resin, and amino-based resin. As will be described later, the resin layer 5 is used as a base material for plating and growth of the conductive layer 30 and first magnetic layer 10. The thickness of the resin layer 5 is about 1.8 μm, for example.

The conductive layer 30 is formed of a good conductor such as Cu and mainly acts to reflect the high-frequency component of electromagnetic wave noise. The conductive layer 30 includes a first conductive layer 31 positioned on the side close to the resin layer 5 and a second conductive layer 32 positioned on the side close to the first magnetic layer 10. Although the first and second conductive layers 31 and 32 are formed of the same metal material, the second conductive layer 32 is smaller in average crystal grain size than the first conductive layer 31. The average crystal grain sizes in the first and second conductive layers 31 and 32 are each obtained by observing the cross section thereof along the thickness direction of the first and second conductive layers 31 and 32 with a scanning electron microscope and averaging maximum lengths of areas surrounded by grain boundaries which are measured in a SEM image of the cross section. Although not particularly limited, assuming that the thicknesses of the first and second conductive layers 31 and 32 are a and b, respectively, $0.65 \leq a/b \leq 7.1$ may be satisfied.

The first magnetic layer 10 is formed of a permalloy mainly composed of a first metal component of Ni and a second metal component made of Fe and acts to convert the low-frequency component of electromagnetic wave noise into heat by colleting magnetic flux. In addition to the first metal component of Ni and second metal component made of Fe, the first magnetic layer 10 contains a third metal component made of metal other than Ni and Fe. The third metal component may be selected from among metals lower in resistivity than Ni and Fe. For example, the third metal component may be selected from among noble metals, may be from among Ag, Pd, and Cu, or may be Cu. The third metal component is not uniform in distribution. That is, the first magnetic layer 10 has a structure in which a first region 11 lower in concentration of the third metal component and a second region 12 higher in concentration of the third metal component are alternately stacked in the thickness direction.

The first region 11 is thicker than the second region 12 and constitutes the main part of the first magnetic layer 10. The thickness of the first region 11 is, for example, 100 nm to 1000 nm, and the thickness of the second region 12 is, for example, 10 nm to 100 nm. A first magnetic material constituting the first region 11 has a larger content of Ni as the first metal component than Fe as the second metal component. The first region 11 contains the third metal component and has a larger content of Fe as the second metal component than the third metal component. For example, assuming that the total amount of the material constituting the first region 11 is defined as 100, Ni as the first metal component accounts for 75% to 85%, Fe as the second metal component accounts for 15% to 25%, and Cu as the third metal component accounts for 1% to 5%. That is, the first region 11 is formed of a permalloy having a less amount of a component other than Ni as the first metal component and Fe as the second metal component. The second region 12 is positioned between a plurality of the first regions 11 stacked in the thickness direction and acts to reduce the resistance value of the first magnetic layer 10 in the thickness direction. A second magnetic material constituting the second region 12 has a larger content of Ni as the first metal component than Fe as the second metal component. The second region 12 contains the third metal component and has a larger content of Fe as the second metal component than the third metal component. For example, assuming that the total amount of the material constituting the second region 12 is defined as 100, Ni as the first metal component accounts for 75% to 85%, Fe as the second metal component accounts for 5% to 15%, and Cu as the third metal component accounts for 5% to 15%. That is, the second region 12 is smaller in content of Fe than the first region 11 and thus has a permeability lower than the first region 11. On the other hand, the second region 12 has a large content of Cu as the third metal component and thus has a lower resistivity than the first region 11. However, when the second region 12 contains Cu as the third metal component too much, the permeability becomes too low, so that the content of Cu as the third metal component may be lower than the content of Fe as the second metal component. The first and second regions 11 and 12 may each contain other components such as oxygen.

The first magnetic layer 10 has one or more second regions 12. Although the number of layers of the second regions 12 is not particularly limited, it may be set within a range where a target shielding effect can be exhibited since an excessively large number of the layers of the second region 12 results in reduction in the permeability of the first magnetic layer 10 in the thickness direction. The thickness of the second region 12 may be set sufficiently smaller than the thickness of the first region 11 so as to achieve sufficient permeability of the first magnetic layer 10 in the thickness direction. Specifically, the thickness of the second region 12 may be set to equal to or less than $\frac{1}{10}$ of the thickness of the first region 11. For example, when the entire thickness of the first magnetic layer 10 is about 3 μm, and the thickness of one second region 12 is about 10 nm, the number of layers of the second region 12 may be set to equal to or less than about 30.

Even when neither the first region 11 nor second region 12 contains the third metal component, a smaller content of Fe as the second metal component in the second region 12 than in the first region 11 causes a gradation of resistivity in the thickness direction, thus increasing reflection opportunities of intruded electromagnetic wave noise more than when the resistivity is constant in the thickness direction, which allows achievement of a higher shielding effect.

The metal film 6 is positioned between the conductive layer 30 and the first magnetic layer 10 and acts to prevent oxidization of the first magnetic layer 10 and diffusion of metal between the conductive layer 30 and the first magnetic layer 10. The material of the metal film 6 is not particularly limited as long as it is a metal material that can exhibit such an effect and may be, for example, Ni.

The rustproof layer 7 is provided in the outermost surface layer of the first magnetic layer 10, i.e., on the surface of the first magnetic layer 10 on the side opposite to the conductive layer 30 and acts to protect the surface of the first magnetic layer 10 and to prevent oxidation thereof. The material of the rustproof layer 7 is not particularly limited as long as it can exhibit such an effect and may be an organic film made of an organic material such as resin or an inorganic film made of an inorganic material such as at least one metal selected from a group consisting of Ni, Cr, Al, Ti, Zn, and Ta that easily form a passivation coating film or an alloy containing at least one metal selected from the group.

With the above configuration, the noise suppression sheet 1 according to the present embodiment has a lower resistivity in the thickness direction than when the first magnetic layer 10 is formed of a single magnetic material. In addition, the second region 12 contributing to a reduction in resistance is formed of not a non-magnetic material but a magnetic material containing Ni and Fe, so that magnetic resistance in the thickness direction is sufficiently small and whereby a magnetic field is dispersed, with the result that magnetic saturation is less likely to occur. As described above, the noise suppression sheet 1 according to the present embodiment can exhibit a high shielding effect especially in a low-frequency region.

Further, the first region 11 need not necessarily have a uniform composition but may have a portion where the concentration of Fe as the second metal component decreases in a direction away from the conductive layer 30. Such concentration distribution causes a gradation of resistivity in the thickness direction, thus increasing reflection opportunities of intruded electromagnetic wave noise more than when the resistivity is constant in the thickness direction, which allows achievement of a higher shielding effect. Further, the composition of each of the plurality of stacked first regions 11 need not necessarily be uniform, and the concentration of Fe as the second metal component may decrease in a direction away from the conductive layer 30. That is, the concentration of Fe as the second metal component may be lower in the first region 11 located at a position relatively far from the conductive layer 30 than in the first region 11 located at a position relatively close to the conductive layer 30. In this case, a gradation of resistivity is caused in the thickness direction, thus increasing reflection opportunities of intruded electromagnetic wave noise more than when the resistivity is constant in the thickness direction, which allows achievement of a higher shielding effect.

The following describes a manufacturing method for the noise suppression sheet 1 according to the present embodiment.

FIGS. 3A to 3D are process views for explaining the manufacturing method for the noise suppression sheet 1 according to the present embodiment.

Figure 3A:
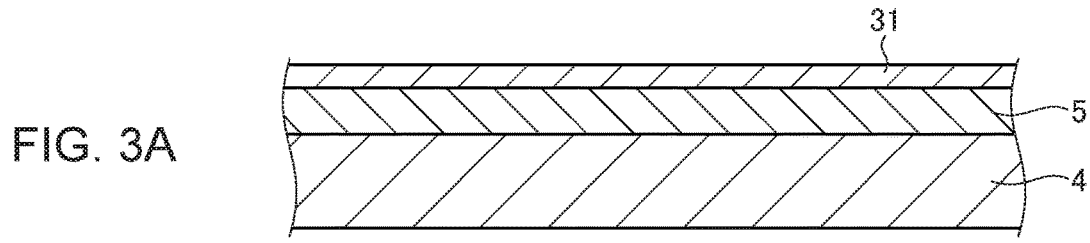
FIGS. 3A to 3D are process views for explaining the manufacturing method for the noise suppression sheet 1.
Figure 3B:
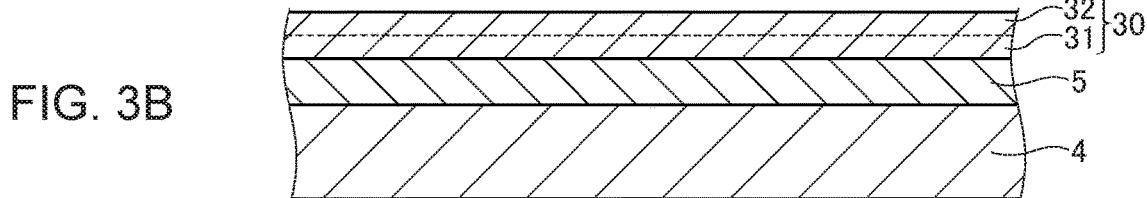
Figure 3C:
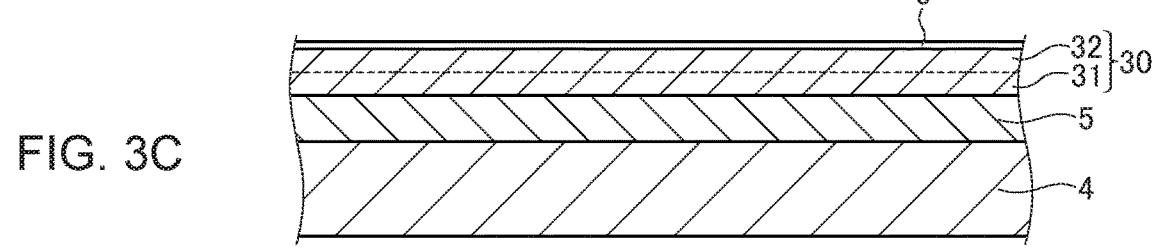

First, as illustrated in FIG. 3A, a laminated body of the peeling layer 4 and resin layer 5 is prepared, and electroless plating is applied to the surface of the resin layer 5 to form the first conductive layer 31. Then, as illustrated in FIG. 3B, electrolytic plating is applied with the first conductive layer 31 used as a power feeder to form the second conductive layer 32 on the surface of the first conductive layer 31. At this time, the crystal grain size in the first conductive layer 31 formed by electroless plating becomes relatively large to make it possible to enhance adhesion between the first conductive layer 31 and the resin layer 5 by an anchor effect. On the other hand, the crystal grain size in the second conductive layer 32 formed by electrolytic plating becomes relatively small. Then, as illustrated in FIG. 3C, electrolytic plating is applied to the surface of the second conductive layer 32 to form the metal film 6. When the second conductive layer 32 serving as a base for the metal film 6 has a high surface smoothness, the initial precipitation of the metal film 6 becomes stable. The surface roughness of the second conductive layer 32 may be 0.2 μm to 4.0 μm in maximum height Rz.

Figure 3D:
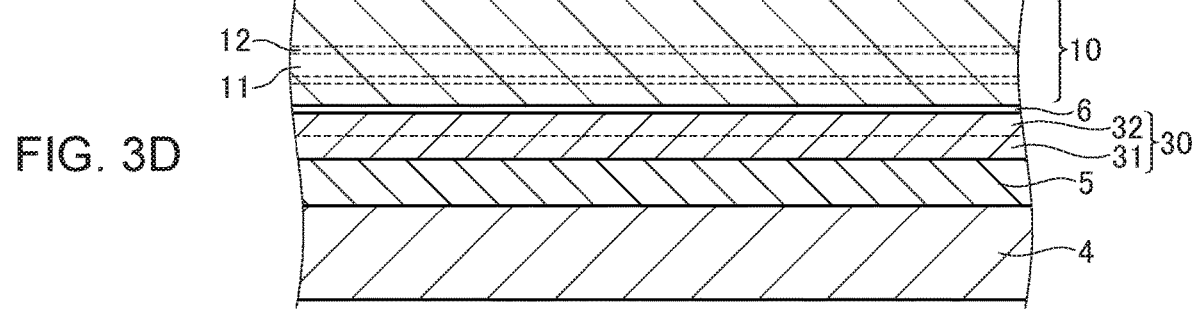

Then, as illustrated in FIG. 3D, electrolytic plating is applied to the surface of the metal film 6 to form the first magnetic layer 10. At this time, by periodically changing the condition of electrolytic plating, the first and second regions 11 and 12 can be alternately formed. Further, by interposing the second region 12 between the first regions 11, crystal growth is once reset, thereby preventing deterioration in magnetic characteristics due to enlargement of crystal grain size. Further, the stable initial precipitation of the metal film 6 also stabilizes the initial precipitation of the first magnetic layer 10. Then, the rustproof layer 7 is formed on the surface of the first magnetic layer 10, whereby the noise suppression sheet 1 according to the present embodiment illustrated in FIG. 2 is completed.

Figure 4:
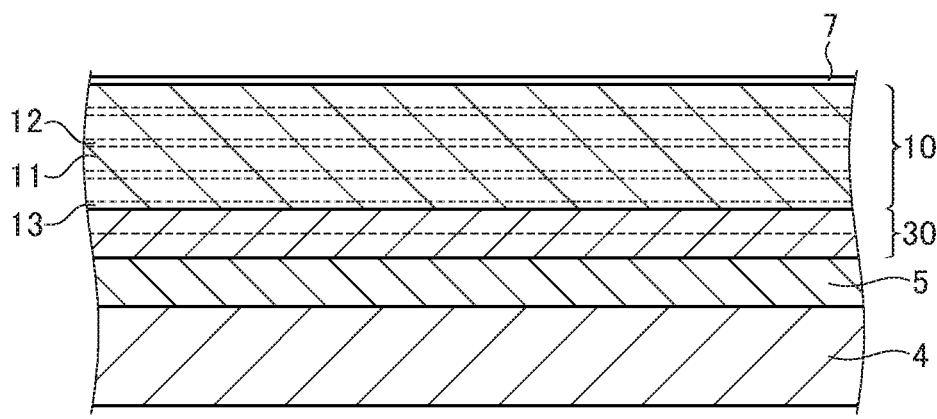
FIG. 4 is a schematic cross-sectional view for explaining the structure of a noise suppression sheet 2 according to a second embodiment.

FIG. 4 is a schematic cross-sectional view for explaining the structure of a noise suppression sheet 2 according to a second embodiment.

As illustrated in FIG. 4, the noise suppression sheet 2 according to the second embodiment differs from the noise suppression sheet 1 according to the first embodiment in that, instead of omitting the metal film 6, the surface area of the first magnetic layer 10 that contacts the conductive layer 30 constitutes an Fe-rich layer 13. The Fe-rich layer 13 constitutes a part of the first region 11 where the concentration of Fe as the second metal component is locally high. That is, Fe concentration in the Fe-rich layer 13 is higher than that in a part of the first region 11 other than the Fe-rich layer 13. Other basic configurations are the same as those of the noise suppression sheet 1 according to the first embodiment, so the same reference numerals are given to the same elements, and overlapping description will be omitted.

In the present embodiment, although the conductive layer 30 and the first magnetic layer 10 directly contact each other, the Fe-rich layer 13 is provided at the surface area of the first magnetic layer 10 that contacts the conductive layer 30, which means that the body-centered cubic structure of Fe abundantly contained in the Fe-rich layer 13 is interposed between the face-centered cubic structure of Cu constituting the conductive layer 30 and the face-centered cubic structure of Ni which is the main component of the first magnetic layer 10. With this configuration, a crystal structure is once reset upon formation of the first magnetic layer 10 by electrolytic plating, suppressing crystal grain size in the first magnetic layer 10 at the time of initial precipitation, which allows achievement of higher magnetic characteristics.

Figure 5:
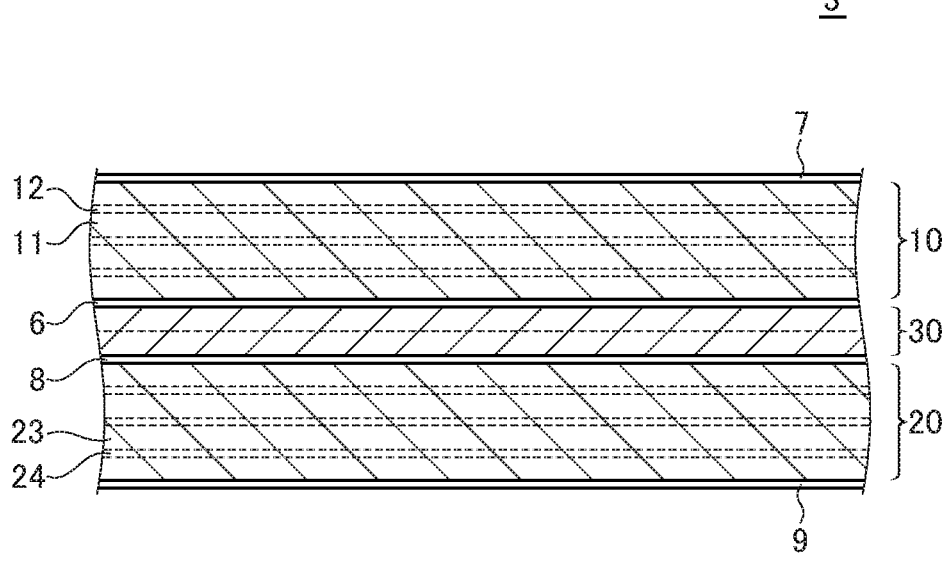
FIG. 5 is a schematic cross-sectional view for explaining the structure of a noise suppression sheet 3 according to a third embodiment.

FIG. 5 is a schematic cross-sectional view for explaining the structure of a noise suppression sheet 3 according to a third embodiment.

As illustrated in FIG. 5, in the noise suppression sheet 3 according to the third embodiment, instead of omitting the peeling layer 4 and resin layer 5, a second magnetic layer 20 is provided on the side opposite to the first magnetic layer 10 with respect to the conductive layer 30. A metal film 8 made of the same material as the metal film 6 is provided between the conductive layer 30 and the second magnetic layer 20, and a rustproof layer 9 made of the same material as the rustproof layer 7 is provided in the outermost surface layer of the second magnetic layer 20 positioned on the side opposite to the conductive layer 30. Other basic configurations are the same as those of the noise suppression sheet 1 according to the first embodiment, so the same reference numerals are given to the same elements, and overlapping description will be omitted.

The second magnetic layer 20 is formed of basically the same material as the first magnetic layer 10, and they have basically the same structure. That is, the second magnetic layer 20 is formed of an alloy mainly composed of the first metal component of Ni and the second metal component of Fe and has a structure in which a third region 23 having a low concentration of Cu as the third metal component and a fourth region 24 having a high concentration of Cu as the third metal component are alternately stacked in the thickness direction. The composition of the third region 23 is basically the same as that of the first region 11 of the first magnetic layer 10, and the composition of the fourth region 24 is basically the same as that of the second region 12 of the first magnetic layer 10.

As described above, the noise suppression sheet 3 according to the present embodiment has the first and second magnetic layers 10 and 20 mainly composed of a permalloy on both sides of the conductive layer 30 formed of Cu, so that it is possible to exhibit a higher shielding effect especially in a low-frequency region. The noise suppression sheet 3 having such a structure can be manufactured by forming the metal films 6 and 8 on the respective front and back sides of the conductive layer 30 by electrolytic plating and then forming the first and second magnetic layers 10 and 20. However, the compositions of the first and second magnetic layers 10 and 20 need not necessarily be the same but may be different. For example, the concentration of Fe as the second metal component contained in the second magnetic layer 20 may be lower than the concentration of Fe as the second metal component contained in the first magnetic layer 10. This makes magnetic characteristics on the front and back sides of the conductive layer 30 different, so that it is possible to exhibit a shielding effect in a wider frequency band.

While the preferred embodiment of the present disclosure has been described, the present disclosure is not limited to the above embodiment, and various modifications may be made within the scope of the present disclosure, and all such modifications are included in the present disclosure.

For example, although the first magnetic layer 10 and conductive layer 30 are provided so as to be stacked one on another in each of the above embodiments, the conductive layer 30 may be omitted depending on a target frequency band.

The technology according to the present disclosure includes the following configuration examples but not limited thereto.

A noise suppression sheet according to one aspect of the present disclosure includes a first magnetic layer. The first magnetic layer includes a plurality of first regions stacked in the thickness direction of the noise suppression sheet and a second region positioned between the first regions and includes a first metal component of Ni, a second metal component of Fe, and a third metal component other than Ni and Fe. The concentration of the third metal component in the second region is higher than the concentration of the third metal component in the first region. With this configuration, it is possible to provide a noise suppression sheet having a high shielding effect.

In the above noise suppression sheet, the third metal component may be made of metal having a lower resistivity than Ni and Fe. This allows a further reduction in the resistivity of the second region.

In any of the above noise suppression sheets, the thickness of the second region may be smaller than the thickness of each of the first regions. This can sufficiently ensure the permeability of the entire first magnetic layer.

In any of the above noise suppression sheets, the proportion of the second metal component in the second region may be lower than the proportion of the first metal component therein and may be higher than the proportion of the third metal component therein. This can sufficiently ensure the permeability of the second region.

In any of the above noise suppression sheets, the first magnetic layer includes a plurality of the second regions, and the plurality of first regions and the plurality of second regions may be alternately stacked in the thickness direction. This can achieve a structure in which the plurality of first regions having a high permeability are connected in parallel through the second region having a low resistivity.

Any of the above noise suppression sheets may further have a conductive layer positioned so as to overlap the first magnetic layer. This allows the high-frequency component of electromagnetic wave noise to be reflected.

In any of the above noise suppression sheets, the conductive layer may include a first conductive layer and a second conductive layer positioned between the first conductive layer and the first magnetic layer and having a smaller average grain size than the first conductive layer. This facilitates the formation of a plated film with the second conductive layer used as a base.

In any of the above noise suppression sheets, the concentration of the second metal component in one of the plurality of the first regions adjacent to the conductive layer may be higher than the concentration of the second metal component in other of the plurality of the first regions. Thus, a crystal structure is parted at a portion where the concentration of the second metal component is high, making it possible to prevent enlargement of the crystal grain size of the first magnetic layer.

Any of the above noise suppression sheets may further have a metal film provided between the conductive layer and the first magnetic layer and made of a metal material different from that of the conductive layer. This prevents oxidization of the first magnetic layer and diffusion of metal between the conductive layer and the first magnetic layer.

In any of the above noise suppression sheets, the first region may have a portion where the concentration of the second metal component decreases in a direction away from the conductive layer. This increases reflection opportunities of intruded electromagnetic wave noise, allowing achievement of a higher shielding effect.

Any of the above noise suppression sheets may further have an organic film on the surface of the first magnetic layer on the side opposite to the conductive layer. This can prevent oxidation of the first magnetic layer.

Any of the above noise suppression sheets may further have an inorganic film on the surface of the first magnetic layer on the side opposite to the conductive layer, the inorganic film being made of at least one metal selected from a group consisting of Ni, Cr, Al, Ti, Zn, and Ta or an alloy containing at least one metal selected from the group. This can prevent oxidization of the first magnetic layer.

Any of the above noise suppression sheets may further include a second magnetic layer provided on the surface of the conductive layer on the side opposite to the first magnetic layer. The second magnetic layer may include a plurality of third regions stacked in the thickness direction of the noise suppression sheet and a fourth region positioned between the third regions and includes the first to third metal components. The concentration of the third metal component in the fourth region may be higher than the concentration of the third metal component in the third region. With this configuration, the conductive layer is sandwiched between the first and second magnetic layers, so that it is possible to enhance a shielding effect in a low-frequency region.

In any of the above noise suppression sheets, the concentration of the second metal component in the second magnetic layer may be lower than the concentration of the second metal component in the first magnetic layer. This makes magnetic characteristics on the front and back sides of the conductive layer different, so that it is possible to exhibit a shielding effect in a wider frequency band.

A noise suppression sheet according to another aspect of the present disclosure includes a plurality of first regions containing a first magnetic material and stacked in the thickness direction thereof and a second region containing a second magnetic material and positioned between the first regions. The first and second magnetic materials each contain a first metal component of Ni and a second metal component of Fe. The proportion of the first metal component in the first magnetic material is higher than the proportion of the second metal component therein. The proportion of the first metal component in the second magnetic material is higher than the proportion of the second metal component therein. The second region has a lower resistivity than each of the first regions. With this configuration, it is possible to electrically connect the plurality of first regions in parallel while ensuring a sufficient permeability in the thickness direction and thus to exhibit a high shielding effect.

A cable according to the present disclosure includes a cable body and any of the noise suppression sheets described above wound around the cable body. With this configuration, it is possible to provide a cable having a noise suppression sheet with a high shielding effect.

What is claimed is:
1. A noise suppression sheet comprising a first magnetic layer, wherein the first magnetic layer includes a plurality of first regions stacked in a thickness direction of the noise suppression sheet and a second region positioned between the first regions, wherein the first magnetic layer includes a first metal component of Ni, a second metal component of Fe, and a third metal component other than Ni and Fe, wherein a thickness of the second region in the thickness direction of the noise suppression sheet is smaller than a thickness of each of the first regions in the thickness direction of the noise suppression sheet, and wherein a concentration of the third metal component in the second region is higher than a concentration of the third metal component in the first regions.

2. The noise suppression sheet as claimed in claim 1, wherein the third metal component is made of metal having a lower resistivity than Ni and Fe.

3. The noise suppression sheet as claimed in claim 1, wherein a proportion of the second metal component in the second region is lower than a proportion of the first metal component therein and is higher than a proportion of the third metal component therein.

4. The noise suppression sheet as claimed in claim 1, wherein the first magnetic layer includes a plurality of the second regions, and wherein the plurality of first regions and the plurality of second regions are alternately stacked in the thickness direction.

5. The noise suppression sheet as claimed in claim 1, further comprising a conductive layer positioned so as to overlap the first magnetic layer.

6. The noise suppression sheet as claimed in claim 5, wherein the conductive layer includes a first conductive layer and a second conductive layer positioned between the first conductive layer and the first magnetic layer and having a smaller average grain size than the first conductive layer.

7. The noise suppression sheet as claimed in claim 5, wherein a concentration of the second metal component in one of the plurality of first regions adjacent to the conductive layer is higher than a concentration of the second metal component in other of the plurality of the first regions.

8. The noise suppression sheet as claimed in claim 5, further comprising a metal film provided between the conductive layer and the first magnetic layer and made of a metal material different from that of the conductive layer.

9. The noise suppression sheet as claimed in claim 5, wherein the first regions have a portion where a concentration of the second metal component decreases in a direction away from the conductive layer.

10. The noise suppression sheet as claimed in claim 5, further comprising an organic film on a surface of the first magnetic layer on a side opposite to the conductive layer.

11. The noise suppression sheet as claimed in claim 5, further comprising an inorganic film on a surface of the first magnetic layer on a side opposite to the conductive layer, wherein the inorganic film is made of at least one metal selected from a group consisting of Ni, Cr, Al, Ti, Zn, and Ta or an alloy containing at least one metal selected from the group.

12. The noise suppression sheet as claimed in claim 5, further comprising a second magnetic layer provided on a surface of the conductive layer on a side opposite to the first magnetic layer, wherein the second magnetic layer includes a plurality of third regions stacked in a thickness direction of the noise suppression sheet and a fourth region positioned between the third regions, wherein the second magnetic layer includes the first to third metal components, and wherein a concentration of the third metal component in the fourth region is higher than a concentration of the third metal component in the third regions.

13. The noise suppression sheet as claimed in claim 12, wherein a concentration of the second metal component in the second magnetic layer is lower than a concentration of the second metal component in the first magnetic layer.

14. A noise suppression sheet comprising:

a plurality of first regions containing a first magnetic material and stacked in a thickness direction thereof; and a second region containing a second magnetic material and positioned between the first regions, wherein each of the first and second magnetic materials contains a first metal component of Ni and a second metal component of Fe, wherein a proportion of the first metal component in the first magnetic material is higher than a proportion of the second metal component therein, wherein a proportion of the first metal component in the second magnetic material is higher than a proportion of the second metal component therein, and wherein the second region has a lower resistivity than each of the first regions.

15. A cable comprising:

a cable body; and a noise suppression sheet wound around the cable body, wherein the noise suppression sheet comprises a first magnetic layer, wherein the first magnetic layer includes a plurality of first regions stacked in a thickness direction of the noise suppression sheet and a second region positioned between the first regions, wherein the first magnetic layer includes a first metal component of Ni, a second metal component of Fe, and a third metal component other than Ni and Fe, wherein a thickness of the second region in the thickness direction of the noise suppression sheet is smaller than a thickness of each of the first regions in the thickness direction of the noise suppression sheet, and wherein a concentration of the third metal component in the second region is higher than a concentration of the third metal component in the first regions.

* * * * *